(12) United States Patent
Jou et al.

(10) Patent No.: US 8,188,490 B2
(45) Date of Patent: May 29, 2012

(54) ORGANIC LIGHT EMITTING DIODE AND MANUFACTURING METHOD THEREOF

(75) Inventors: Jwo-Huei Jou, Hsinchu (TW); Kuo-Yen Tsend, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 64 days.

(21) Appl. No.: 12/944,887

(22) Filed: Nov. 12, 2010

(65) Prior Publication Data

US 2012/0049165 A1 Mar. 1, 2012

(30) Foreign Application Priority Data

Aug. 31, 2010 (TW) .............................. 99129370 A

(51) Int. Cl.
*H01L 33/00* (2010.01)
(52) U.S. Cl. ....... 257/88; 438/91; 438/99; 257/E21.006; 257/E21.053; 257/E21.267; 257/E21.352; 257/774
(58) Field of Classification Search .................... 257/88, 257/761, 762, 783, 771, 770, 774, E21.006, 257/E21.053, E21.267, E21.351; 438/91, 438/99
See application file for complete search history.

(56) References Cited

U.S. PATENT DOCUMENTS

| 7,528,003 | B2 * | 5/2009 | Liu ................................. 438/99 |
| 7,550,915 | B2 * | 6/2009 | Stegamat et al. ............. 313/504 |
| 7,915,807 | B2 * | 3/2011 | Seo et al. ....................... 313/504 |
| 7,977,877 | B2 * | 7/2011 | DeCook et al. ............... 313/512 |
| 8,007,927 | B2 * | 8/2011 | Lin et al. ....................... 428/690 |

* cited by examiner

*Primary Examiner* — David Nhu
(74) *Attorney, Agent, or Firm* — Harness, Dickey & Pierce, PLC

(57) ABSTRACT

The present invention discloses an organic light emitting diode and a manufacturing method thereof. The OLED comprises a first electrode, a first hole-transporting layer disposed on the first electrode, a second hole-transporting layer disposed on the first hole-transporting layer, a first light-emitting layer disposed on the second hole-transporting layer, an electron-transporting layer disposed on the first light-emitting layer, an electron injection layer disposed on the electron-transporting layer and a second electrode disposed on the electron injection layer. The energy level of the first light-emitting layer in the lowest unoccupied molecular orbital is lower than that of the second hole-transporting layer, and the thickness of the first hole-transporting layer is larger than that of the second hole-transporting layer.

16 Claims, 5 Drawing Sheets

ORGANIC LIGHT EMITTING DIODE AND MANUFACTURING METHOD THEREOF

CROSS-REFERENCE TO RELATED APPLICATIONS

This application claims the benefit and priority of Taiwan application No. 099129370, filed Aug. 31, 2010. The entire disclosure of the above application is incorporated herein by reference.

FIELD OF THE INVENTION

The present invention relates to an organic light emitting diode and a manufacturing method thereof, and more particularly to an organic light emitting diode and a manufacturing method thereof which confines the electrons by means of complex multi-layer structures.

BACKGROUND OF THE INVENTION

Currently, the organic light emitting diode (OLED) consecutively arranges a first electrode, a hole-transporting layer (HTL), a organic light-emitting layer (EML) and a second electrode on a glass substrate. In addition, the electrons and electronic holes, produced by the first electrode and the second electrode, propagate and re-couple inside the organic light-emitting layer as a result of external electrical field, so as to release energies to ignite the emitting molecules of the organic light-emitting layer lighting.

As well known, the emitting efficiency of the organic light emitting diode has generally determined by whether the electrons and the electronic holes couple efficiently in the organic light-emitting layer. However, there exist energy level differences among each layer of the organic light emitting diode, and the transporting velocities of the electrons and the electronic holes are different. Moreover, the prior membrane structures of the organic light emitting diode are designed simply; hence, the adjustable materials and parameters are confined. As a result, it is difficult to provide efficient control for the re-coupling of the electrons and the electronic holes. Therefore, the emitting efficiency of the organic light emitting diode becomes poor, and the non-coupled electrons and electronic holes also make the destruction of the first electrode and the second electrode, such that the lifetime of the organic light emitting diode is getting shorter.

SUMMARY OF THE INVENTION

A primary objective of the present invention is to provide an organic light emitting diode and a manufacturing method thereof, so as to resolve the weakness of shorter lifetime and bad emitting efficiency of the organic light emitting diode according to the aforesaid prior art.

To achieve the above and other objectives, the organic light emitting diode according to the present invention includes a first electrode, a first hole-transporting layer, a second hole-transporting layer, a first light-emitting layer, an electron-transporting layer, an electron injection layer and a second electrode. Preferably, the first hole-transporting layer is disposed on the first electrode, and the second hole-transporting layer is disposed on the first hole-transporting layer. Moreover, the first light-emitting layer is disposed on the second hole-transporting layer, and the first light-emitting layer has an energy level in a lowest unoccupied molecular orbital (LUMO) lower than that of the second hole-transporting layer. Furthermore, the electron-transporting layer is disposed on the first light-emitting layer, the electron injection layer is disposed on the electron-transporting layer, and otherwise the second electrode is disposed on the electron injection layer. The first hole-transporting layer has a thickness larger than that of the second hole-transporting layer.

The organic light emitting diode according to the present invention further comprises a third hole-transporting layer and a second light-emitting layer. The third hole-transporting layer is disposed on the first light-emitting layer, and the second light-emitting layer is disposed on the third hole-transporting layer. The third hole-transporting layer has a thickness smaller than that of the second hole-transporting layer, and the second light-emitting layer has a thickness larger than that of the first light-emitting layer.

The thickness of second hole-transporting layer is ranged between 5 nm and 20 nm.

The total thickness of the first light-emitting layer and the second light-emitting layer is ranged between 110 nm and 150 nm.

The thickness of the third hole-transporting layer is not larger than 5 nm.

In addition, the first hole-transporting layer is 3,4-ethylenedioxythiophene-polystyrene sulfonate (PEDOT:PSS).

The second hole-transporting layer and the third hole-transporting layer are 1,1-bis[(di-4-toluene-based amino) phenyl]cyclohexane (TAPC).

The first light-emitting layer and the second light-emitting layer are 2,7-Bis (2-[phenyl(m-methylphenyl)amino]-9,9-dimethyl-fluorene-7-yl)-9,9-dimethyl-fluorine (MDP3FL).

According to the above objectives of the present invention, a manufacturing method of the organic light emitting diode is provided, and the process includes the following steps: providing a substrate; forming a first electrode on the substrate; forming a first hole-transporting layer on the first electrode; forming a second hole-transporting layer on the first hole-transporting layer; forming a first light-emitting layer on the second hole-transporting layer, and the first light-emitting layer having an energy level in a lowest unoccupied molecular orbital lower than that of the second hole-transporting layer; forming an electron-transporting layer on the first light-emitting layer; forming an electron injection layer on the electron-transporting layer and forming a second electrode on the electron injection layer. In addition, the first hole-transporting layer has a thickness larger than that of the second hole-transporting layer.

Accordingly, the manufacturing method further includes: forming a third hole-transporting layer on the first light-emitting layer and forming a second light-emitting layer on the third hole-transporting layer. The third hole-transporting layer has a thickness smaller that of the second hole-transporting layer and the second light-emitting layer has a thickness larger than that of the first light-emitting layer.

Accordingly, the thickness of the second hole-transporting layer is ranged between 5 nm and 20 nm.

The total thickness of the first light-emitting layer and the second light-emitting layer is ranged between 110 nm and 150 nm.

The thickness of the third hole-transporting layer is not larger than 5 nm.

In addition, the first hole-transporting layer is 3,4-ethylenedioxythiophene-polystyrene sulfonate.

The second hole-transporting layer and the third hole-transporting layer are 1,1-bis[(di-4-toluene-based amino) phenyl]cyclohexane.

The first light-emitting layer and the second light-emitting layer are 2,7-Bis(2-[phenyl(m-methylphenyl)amino]-9,9-dimethyl-fluorene-7-yl)-9,9-dimethyl-fluorine.

With the above arrangements, the organic light emitting diode and a manufacturing method thereof according to the present invention has one or more of the following advantages:

The organic light emitting diode and a manufacturing method, by means of the complex multi-layer structures of the electron-transporting layer/emitting layers, further confines the electrons inner different emitting layers, so as to enhance the opportunity to re-couple the electrons with electronic holes, and improve the emitting efficiency and brightness of the organic light emitting diode.

BRIEF DESCRIPTION OF THE DRAWINGS

The structure and the technical means adopted by the present invention to achieve the above and other objectives can be best understood by referring to the following detailed description of the preferred embodiments and the accompanying drawings.

DETAILED DESCRIPTION OF THE PREFERRED EMBODIMENTS

Figure 1:
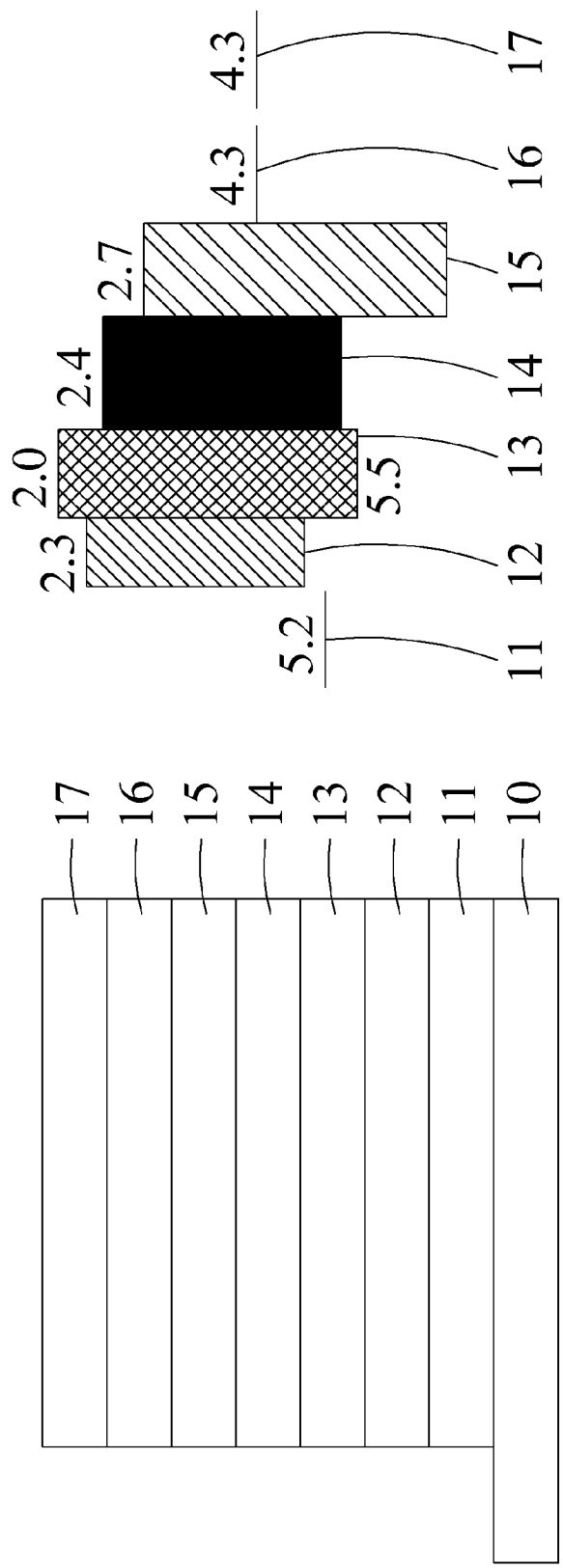
FIG. 1 is a schematic diagram showing an organic light emitting diode according to a first preferred embodiment of the present invention.

Please refer to FIG. 1 which is a schematic diagram showing an organic light emitting diode according to a first preferred embodiment of the present invention. As shown in left part of FIG. 1, the organic light emitting diode comprises a substrate 10, a first electrode 11, a first hole-transporting layer 12, a second hole-transporting layer 13, a first light-emitting layer 14, an electron-transporting layer 15, an electron injection layer 16 and a second electrode 17. Preferably, the first electrode 11 is disposed on the substrate 10, the first hole-transporting layer 12 is disposed on the first electrode 11, and the second hole-transporting layer 13 is disposed on the first hole-transporting layer 12. Moreover, the first light-emitting layer 14 is disposed on the second hole-transporting layer 13, and the first light-emitting layer 14 has an energy level in a lowest unoccupied molecular orbital lower than that of the second hole-transporting layer 13. Furthermore, the electron-transporting layer 15 is disposed on the first light-emitting layer 14, the electron injection layer 16 is disposed on the electron-transporting layer 15, and otherwise the second electrode 17 is disposed on the electron injection layer 16.

According to the first preferred embodiment of the present invention, the aforementioned substrate 10 could be composed of hard or soft material, such as transparent glass substrate or transparent plastic substrate. The first electrode 11 (such as positive pole) is disposed on the substrate 10, and the material of the first electrode 11 could be transparent metallic oxide, such as Indium Tin Oxide (ITO), Indium Zinc Oxide (IZO), Aluminum Zinc Oxide (AZO), Cadmium Tin Oxide or other proper materials alternatively. Otherwise, the first hole-transporting layer 12 has a thickness larger than that of the second hole-transporting layer 13, and the thickness of second hole-transporting layer 13 is ranged between 5 nm and 20 nm. In addition, the first hole-transporting layer 12 is 3,4-ethylenedioxythiophene-polystyrene sulfonate (PEDOT:PSS). To be emphasized, the material of the first hole-transporting layer 12 also could be other well known material which has functionalities of transporting the electronic holes auxiliary.

Particularly, the second hole-transporting layer 13 is 1,1-bis[(di-4-toluene-based amino)phenyl]cyclohexane (TAPC), and there exists extreme large energy thresholds while the electrons crossing the second hole-transporting layer 13, as a result of the energy level in the lowest unoccupied molecular orbital of the first light-emitting layer 14 lower than that of the second hole-transporting layer 13 (please refer to right part of FIG. 1, the marked reference numerals stand for values of the energy level of each layer). As a result, almost all electrons will be confined within the first light-emitting layer 14 so as to enhance the opportunity to couple with electronic holes, and improve the emitting efficiency of the organic light emitting diode 1. In addition, a dual-membrane structure, consisting of the second hole-transporting layer 13 and the first light-emitting layer 14, can avoid the destruction of the first electrode 11 and the second electrode 17 by the non-coupled electrons and electronic holes so as to extend the organic light emitting diode 1 lifetime.

For instance, the first light-emitting layer 14 of the present invention is composed of emitting material such as small molecule organics or polymer, such that it can be integrated into small molecule organics light emitting diode (SM-OLED) or polymer light emitting diode (PLED) respectively. Accordingly, the electron-transporting layer 15 is composed of tris polystyrene benzimidazole (TPBi) and otherwise the electron injection layer 16 is composed of LiF. The second electrode 17 (such as negative pole) is disposed on the electron injection layer 16, and the second electrode 17 is composed of metal or alloy material having better conductivity, which is selected from the group consisting of Aluminum, Calcium, Magnesium, Indium, Tin, Manganese, Chromium, Copper, Silver, Gold and any combination thereof.

Figure 2:
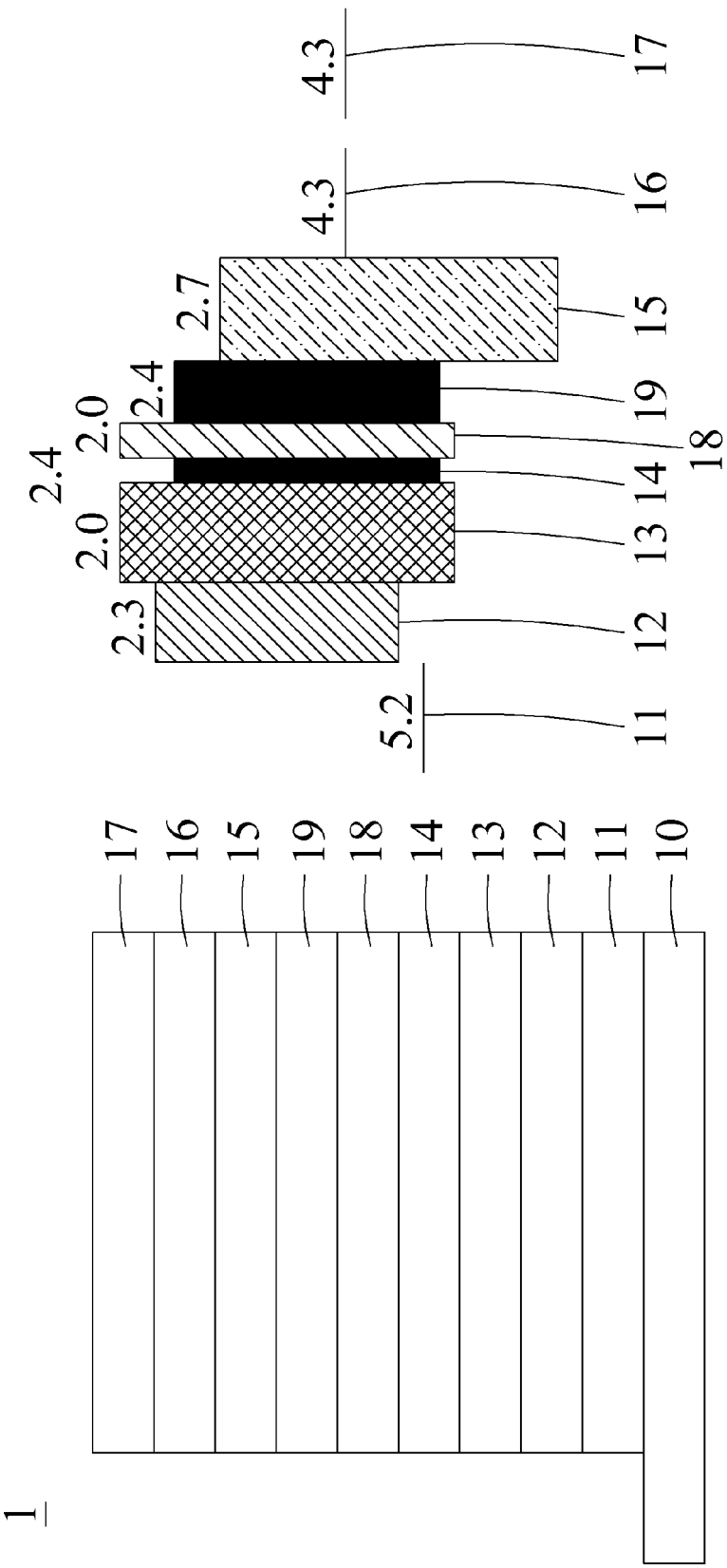
FIG. 2 is a schematic diagram showing an organic light emitting diode according to a second preferred embodiment of the present invention.

Subsequently, please refer to FIG. 2 which is a schematic diagram showing an organic light emitting diode according to a second preferred embodiment of the present invention. As the FIG. 2 shown, the organic light emitting diode 1 of the according to the second preferred embodiment of the present invention further comprises a third hole-transporting layer 18 and a second light-emitting layer 19. The third hole-transporting layer 18 is disposed on the first light-emitting layer 14, the second light-emitting layer 19 is disposed on the third hole-transporting layer 18, and finally the electron-transporting layer 15 is disposed on the second light-emitting layer 19.

According to the present embodiment, the third hole-transporting layer 18 has a thickness smaller than that of the second hole-transporting layer 13, and the second light-emitting layer 19 has a thickness larger than that of the first light-emitting layer 14, wherein the thickness of the third hole-transporting layer 18 is not larger than 5 nm. Furthermore, the second light-emitting layer 19 is 2,7-Bis(2-[phenyl(m-methylphenyl)amino]-9,9-dimethyl-fluorene-7-yl)-9,9-dimethyl-fluorine, and the third hole-transporting layer 18 is 1,1-bis[(di-4-toluene-based amino) phenyl]cyclohexane. Moreover, the total thickness of the first light-emitting layer 14 and the second light-emitting layer 19 is ranged between 110 nm and 150 nm. The present embodiment, by means of two sets of complex multi-layer structure of the electron-transporting layer/emitting layers, further confines the electrons in locations between different emitting layers so as to enhance the opportunity to re-couple the electrons with electronic holes. Consequently, the ordinary skilled person in the art shall understand that the descriptions of the present invention are simply exemplary rather than restrictive, and the set number of complex multi-layer structure of the electron-transporting layer/emitting layers are not confined to one or two.

Accordingly, the method of forming the aforementioned complex multi-layer structures of the electron-transporting layer/emitting layers contain deposition, transferring, spin coating, printing or ink-jet printing processes.

Figure 3:
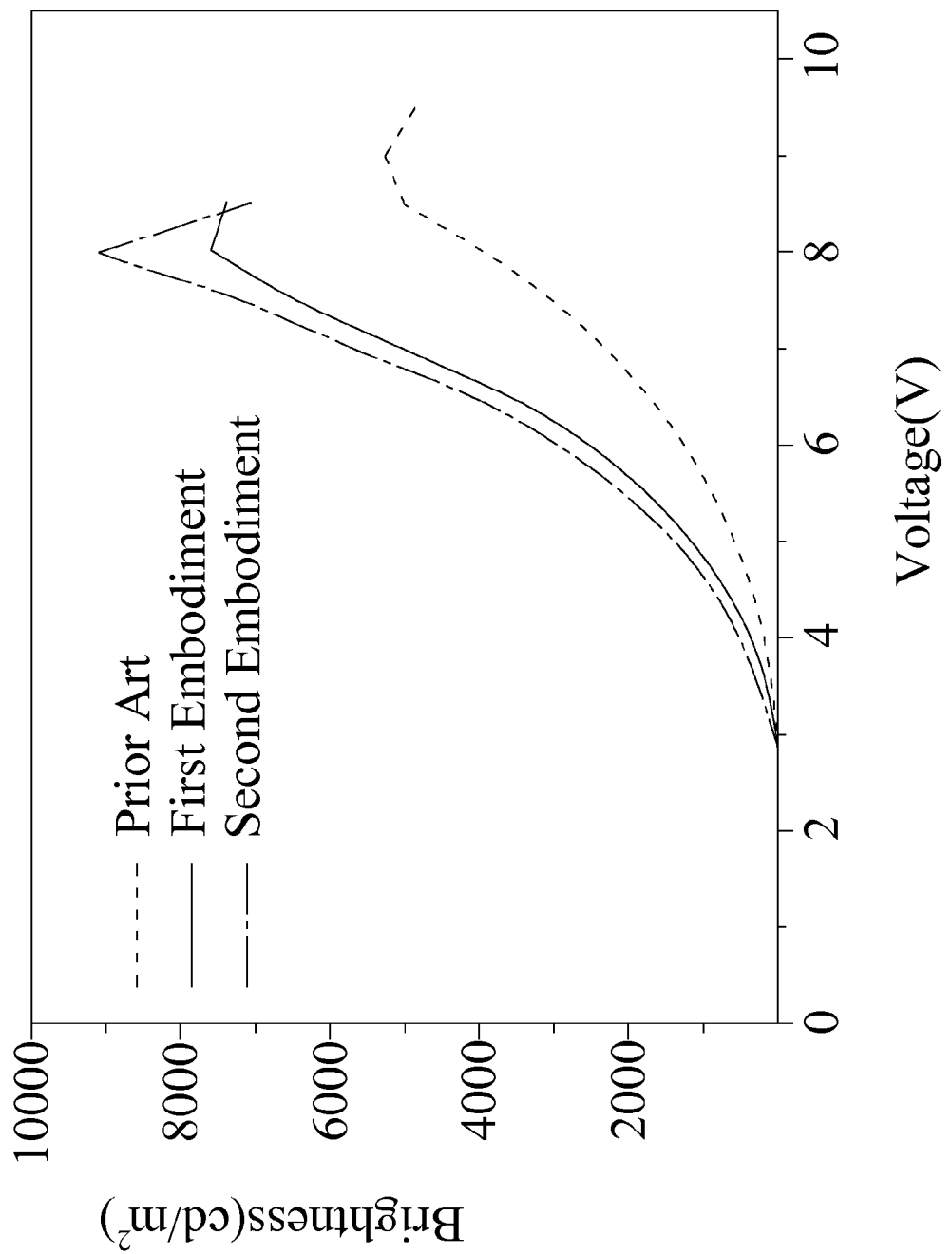
FIG. 3 is a diagram showing brightness of an organic light emitting diode according to the present invention.

Please refer to FIG. 3 which is a diagram showing brightness of an organic light emitting diode according to the present invention. As the FIG. 3 shown, the maximum brightness of the prior organic light emitting diode is 5250 nits, whereas the maximum brightness of the present organic light emitting diode can be up to 7600 nits by utilizing a working voltage of 7.8 Volts, according to the first embodiment of the present invention (one set of complex multi-layer structure of the electron-transporting layer/emitting layers). In addition, the maximum brightness of the present organic light emitting diode can be up to 9130 nits by utilizing a working voltage of 7.8 Volts similarly, according to the second embodiment of the present invention (two sets of complex multi-layer structure of the electron-transporting layer/emitting layers). Therefore, it can be easily known from the FIG. 3 that the present invention exactly confines the electrons in locations between different emitting layers so as to enhance the advantageous to re-couple the electrons with electronic holes and produce more excitons to improve the emitting efficiency of the organic light emitting diode.

Notwithstanding, the concept of manufacturing method of the organic light emitting diode has been mentioned hereinbefore, but the invention still present the manufacturing process in order to describe that more distinctly.

Figure 4:
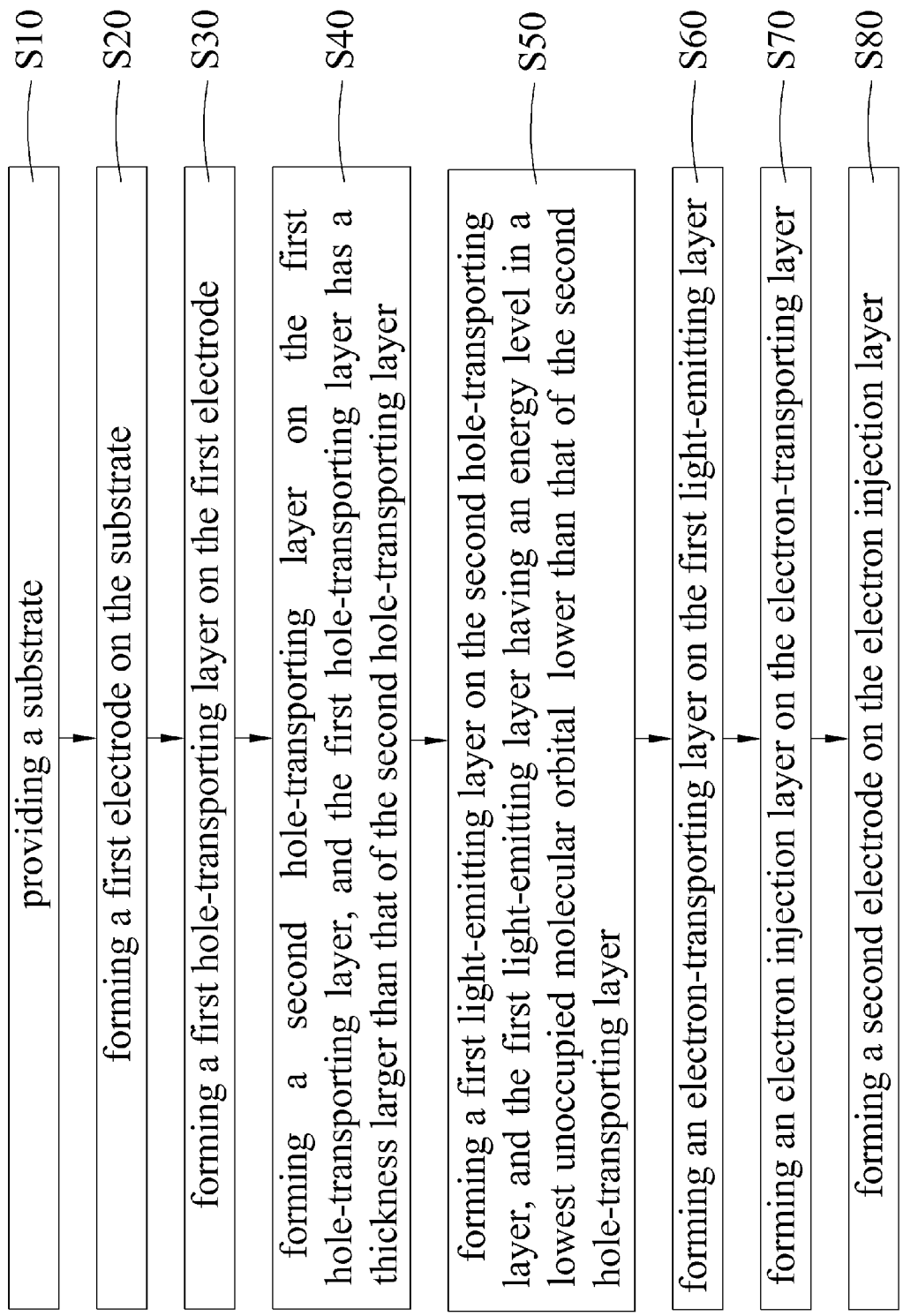
FIG. 4 is a process of manufacturing an organic light emitting diode according to the present invention.

Please refer to FIG. 4 which is a method process of an organic light emitting diode according to the present invention. As the FIG. 4 shown, the manufacturing method includes the following steps:

(S10) providing a substrate;
(S20) forming a first electrode on the substrate;
(S30) forming a first hole-transporting layer on the first electrode;
(S40) forming a second hole-transporting layer on the first hole-transporting layer, and the first hole-transporting layer has a thickness larger than that of the second hole-transporting layer;
(S50) forming a first light-emitting layer on the second hole-transporting layer, and the first light-emitting layer having an energy level in a lowest unoccupied molecular orbital lower than that of the second hole-transporting layer;
(S60) forming an electron-transporting layer on the first light-emitting layer;
(S70) forming an electron injection layer on the electron-transporting layer; and
(S80) forming a second electrode on the electron injection layer.

Figure 5:
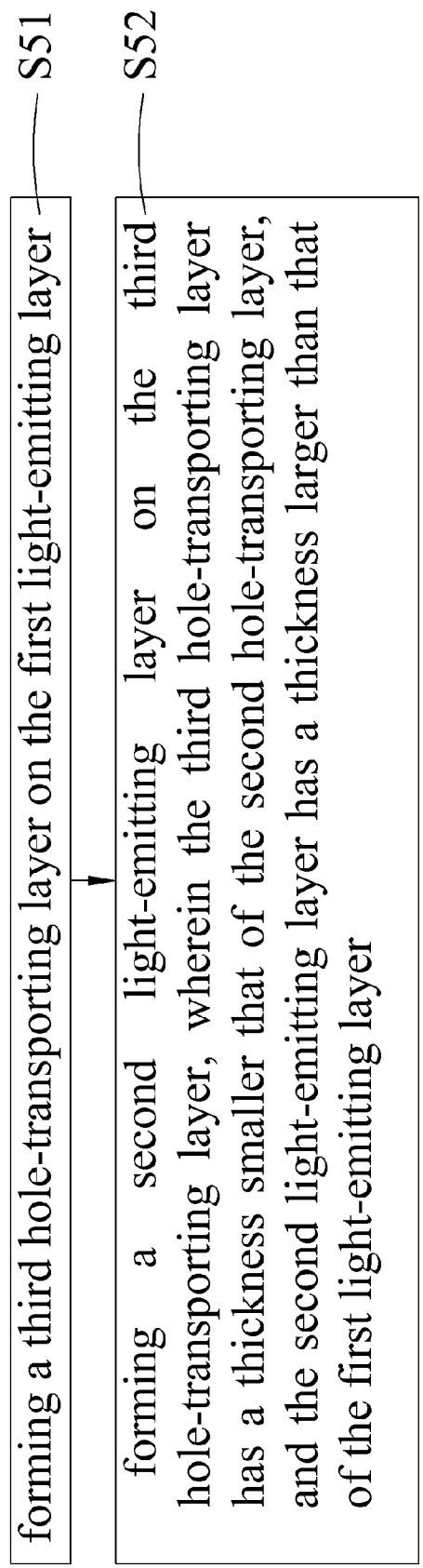
FIG. 5 is another process of manufacturing an organic light emitting diode according to the present invention.

Please refer to FIG. 5 which is another manufacturing process of an organic light emitting diode according to the present invention. As the FIG. 5 shown, the manufacturing method before the step (S60) further includes the following steps:

(S51) forming a third hole-transporting layer on the first light-emitting layer;
(S52) forming a second light-emitting layer on the third hole-transporting layer, wherein the third hole-transporting layer has a thickness smaller that of the second hole-transporting layer, and the second light-emitting layer has a thickness larger than that of the first light-emitting layer.

Consecutively proceeding with the step (S60) after accomplishing the step (S52), the electron-transporting layer is located on the second light-emitting layer. In addition, the method of forming the aforementioned complex multi-layer structures of the electron-transporting layer/emitting layers contain deposition, transferring, spin coating, printing or ink-jet printing processes. In addition, if the adopted method is a wet method, the formed dual-membrane structures (complex multi-layer structure of the electron-transporting layer/emitting layers) can be preceded with baking process. The solubility of the electron-transporting layer differs from that of the emitting layer, thus the occurrence of mixing between the upper/lower dual-membranes can be avoided.

Moreover, the technical characteristics of the organic light emitting diode, made from the aforementioned manufacturing method, has been described hereinbefore, such that the unnecessary description will be skipped.

To be summarized, at least one set of complex multi-layer structure of the electron-transporting layer/emitting layers are formed between the upper/lower electrodes of the organic light emitting diode. The complex multi-layer structure can confine the electrons within each light-emitting layer, so as to enhance the opportunity to couple the electrons with the electronic holes, and improve the emitting efficiency of the organic light emitting diode. Consequently, each complex multi-layer structure can efficiently avoid the destruction of the first electrode and the second electrode by the non-coupled electrons and electronic holes so as to extend the organic light emitting diode lifetime.

The descriptions set forth hereinbefore are simply exemplary rather than restrictive. All effectively equivalent modifications, changes or alternations made thereto without departing from the spirit and scope of the present invention are deemed as being encompassed by the field of the present invention defined as the following claims.

What is claimed is:

1. An organic light emitting diode (OLED), comprising:
a first electrode;
a first hole-transporting layer disposed on said first electrode;
a second hole-transporting layer disposed on said first hole-transporting layer;
a first light-emitting layer disposed on said second hole-transporting layer, and said first light-emitting layer having an energy level in a lowest unoccupied molecular orbital lower than that of said second hole-transporting layer;
an electron-transporting layer disposed on said first light-emitting layer;
an electron injection layer disposed on said electron-transporting layer; and
a second electrode disposed on said electron injection layer, wherein said first hole-transporting layer has a thickness larger than that of said second hole-transporting layer.

2. The organic light emitting diode as claimed in claim 1, further comprising:
a third hole-transporting layer being disposed on said first light-emitting layer; and
a second light-emitting layer being disposed on said third hole-transporting layer, wherein said third hole-transporting layer has a thickness smaller than that of said second hole-transporting layer, and said second light-emitting layer has a thickness larger than that of said first light-emitting layer.

3. The organic light emitting diode as claimed in claim 2, wherein said thickness of said second hole-transporting layer is ranged between 5 nm and 20 nm.

4. The organic light emitting diode as claimed in claim 2, wherein a total thickness of said first light-emitting layer and said second light-emitting layer is ranged between 110 nm and 150 nm.

5. The organic light emitting diode as claimed in claim 2, wherein said thickness of said third hole-transporting layer is smaller than or equal to 5 nm.

6. The organic light emitting diode as claimed in claim 2, wherein said first hole-transporting layer is 3,4-ethylenedioxythiophene-polystyrene sulfonate (PEDOT:PSS).

7. The organic light emitting diode as claimed in claim 2, wherein said second hole-transporting layer and said third hole-transporting layer are 1,1-bis[(di-4-toluene-based amino)phenyl]cyclohexane (TAPC) respectively.

8. The organic light emitting diode as claimed in claim 2, wherein said first light-emitting layer and said second light-emitting layer are 2,7-Bis(2-[phenyl(m-methylphenyl)amino]-9,9-dimethyl-fluorene-7-yl)-9,9-dimethyl-fluorine (MDP3FL) respectively.

9. A manufacturing method of an organic light emitting diode (OLED), comprising:
    providing a substrate;
    forming a first electrode on said substrate;
    forming a first hole-transporting layer on said first electrode;
    forming a second hole-transporting layer on said first hole-transporting layer;
    forming a first light-emitting layer on said second hole-transporting layer, and said first light-emitting layer having an energy level in a lowest unoccupied molecular orbital lower than that of said second hole-transporting layer;
    forming an electron-transporting layer on said first light-emitting layer;
    forming an electron injection layer on said electron-transporting layer; and
    forming a second electrode on said electron injection layer, wherein said first hole-transporting layer has a thickness larger than that of said second hole-transporting layer.

10. The manufacturing method of an organic light emitting diode as claimed in claim 9, further comprising:
    forming a third hole-transporting layer on said first light-emitting layer; and
    forming a second light-emitting layer on said third hole-transporting layer, wherein said third hole-transporting layer has a thickness smaller that of said second hole-transporting layer, and said second light-emitting layer has a thickness larger than that of said first light-emitting layer.

11. The manufacturing method of an organic light emitting diode as claimed in claim 10, wherein said thickness of said second hole-transporting layer is ranged between 5 nm and 20 nm.

12. The manufacturing method of an organic light emitting diode as claimed in claim 10, wherein a total thickness of said first light-emitting layer and said second light-emitting layer is ranged between 110 nm and 150 nm.

13. The manufacturing method of an organic light emitting diode as claimed in claim 10, wherein said thickness of said third hole-transporting layer is smaller than or equal to 5 nm.

14. The manufacturing method of an organic light emitting diode as claimed in claim 10, wherein said first hole-transporting layer is 3,4-ethylenedioxythiophene-polystyrene sulfonate (PEDOT:PSS).

15. The manufacturing method of an organic light emitting diode as claimed in claim 10, wherein said second hole-transporting layer and said third hole-transporting layer are 1,1-bis[(di-4-toluene-based amino)phenyl]cyclohexane (TAPC) respectively.

16. The manufacturing method of an organic light emitting diode as claimed in claim 10, wherein said first light-emitting layer and said second light-emitting layer are 2,7-Bis(2-[phenyl(m-methylphenyl)amino]-9,9-dimethyl-fluorene-7-yl)-9,9-dimethyl-fluorine (MDP3FL) respectively.

* * * * *